(12) United States Patent
Matsukawa et al.

(10) Patent No.: US 11,592,744 B2
(45) Date of Patent: *Feb. 28, 2023

(54) POSITIVE-TYPE PHOTOSENSITIVE RESIN COMPOSITION

(71) Applicant: HITACHI CHEMICAL DUPONT MICROSYSTEMS, LTD., Tokyo (JP)

(72) Inventors: Daisaku Matsukawa, Tokyo (JP); Tadamitsu Nakamura, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 182 days.

This patent is subject to a terminal disclaimer.

(21) Appl. No.: 16/075,441

(22) PCT Filed: Feb. 5, 2016

(86) PCT No.: PCT/JP2016/000618
§ 371 (c)(1),
(2) Date: Aug. 3, 2018

(87) PCT Pub. No.: WO2017/134701
PCT Pub. Date: Aug. 10, 2017

(65) Prior Publication Data
US 2019/0049842 A1  Feb. 14, 2019

(51) Int. Cl.
G03F 7/023 (2006.01)
G03F 7/039 (2006.01)
G03F 7/004 (2006.01)
G03F 7/16 (2006.01)
G03F 7/20 (2006.01)
G03F 7/32 (2006.01)
G03F 7/40 (2006.01)

(52) U.S. Cl.
CPC .............. G03F 7/039 (2013.01); G03F 7/004 (2013.01); G03F 7/023 (2013.01); G03F 7/162 (2013.01); G03F 7/168 (2013.01); G03F 7/2004 (2013.01); G03F 7/322 (2013.01); G03F 7/40 (2013.01)

(58) Field of Classification Search
CPC ........ G03F 7/0233; G03F 7/023; G03F 7/039; G03F 7/0226
See application file for complete search history.

(56) References Cited

U.S. PATENT DOCUMENTS

| 2010/0092879 | A1* | 4/2010 | Minegishi | .............. | C08G 69/26 430/18 |
| 2010/0196808 | A1* | 8/2010 | Mizushima | .............. | C08G 69/42 430/18 |
| 2014/0120462 | A1* | 5/2014 | Minegishi | .............. | G03F 7/0233 430/18 |
| 2019/0041748 | A1* | 2/2019 | Nakamura | .............. | G03F 7/0045 |

FOREIGN PATENT DOCUMENTS

| JP | 2008-224984 A | 9/2008 |
| JP | 2009-265520 A | 11/2009 |
| JP | 2010-096927 A | 4/2010 |
| JP | 2011-148971 A | 8/2011 |
| JP | 2011-164289 A | 8/2011 |
| JP | 2012-082404 A | 4/2012 |
| JP | 2013-205801 A | 10/2013 |
| TW | 201329623 A | 7/2013 |
| WO | 2005/109099 A1 | 11/2005 |
| WO | 2008/111470 A1 | 9/2008 |
| WO | 2009/057638 | 5/2009 |
| WO | 2009/081950 A1 | 7/2009 |
| WO | 2010/001780 A1 | 1/2010 |
| WO | 2011/135887 A1 | 11/2011 |
| WO | 2014/115233 A1 | 7/2014 |

OTHER PUBLICATIONS

Semiconductor technology yearbook 2013 packaging/mounting guide, Nikkei Business Publications, Inc., Dec. 2012, pp. 41 to 50 (cited in specification).

* cited by examiner

Primary Examiner — Daborah Chacko-Davis
(74) Attorney, Agent, or Firm — Fitch, Even, Tabin & Flannery, LLP

(57) ABSTRACT

A positive-type photosensitive resin composition comprises a (a) polybenzoxazole precursor, a (b) crosslinking agent, a (c) photosensitive agent, and a (d) solvent, wherein the (a) polybenzoxazole precursor comprises a structure represented by Formula (1) below, and the (c) photosensitive agent is a compound comprising a structure represented by Formula (2) below. In Formula (1), U is a bivalent organic group, a single bond, —O—, or —SO$_2$—, V is a group comprising an aliphatic structure, and the carbon number in the aliphatic structure is 1 to 30.

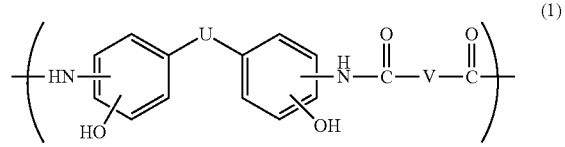

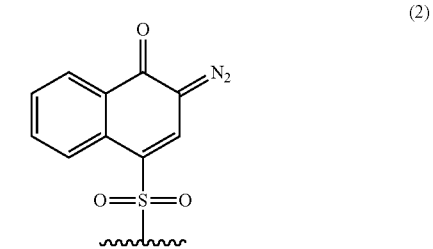

10 Claims, 3 Drawing Sheets

POSITIVE-TYPE PHOTOSENSITIVE RESIN COMPOSITION

CROSS-REFERENCE TO RELATED APPLICATIONS

This application is a U.S. national phase application filed under 35 U.S.C. § 371 of International Application No. PCT/JP2016/000618, filed Feb. 5, 2016, designating the United States, which is hereby incorporated herein by reference in its entirety.

TECHNICAL FIELD

The present invention relates to a positive-type photosensitive resin composition, a cured product of the positive-type photosensitive resin composition, an interlayer insulating film, a cover coat layer, or a surface protection film using the cured product, an electronic component comprising the same, and a method of manufacturing a pattern cured film.

BACKGROUND ART

Heretofore, polyimide or polybenzoxazole having all of satisfactory heat resistance, electric properties, mechanical properties, and the like has been used for a surface protection film and an interlayer insulating film of a semiconductor device. In recent years, a photosensitive resin composition obtained by giving photosensitive properties to the above resins themselves has been used. Thus, a manufacturing process of a pattern cured film can be simplified, and a complicated manufacturing process can be shortened.

In the manufacturing process of a pattern cured film, an organic solvent such as N-methylpyrrolidone has been used in a development step. However, due to an environmental consideration, there has been suggested a resin composition that can be developed with an alkaline aqueous solution by a method in which a naphthoquinonediazide compound is mixed in a polyimide precursor or a polybenzoxazole precursor as a photosensitive agent (e.g., PATENT LITERATURES 1 and 2).

Meanwhile, in recent years, miniaturization of transistors that have supported the enhancement of performance of computers is facing the limit of scaling laws, and it is considered that technology of three-dimensionally stacking semiconductor elements is required for higher performance and higher speeds. Against this background, there has been suggested a three-dimensional package using a through silicon via (TSV), a 2.5-dimensional package using an interposer, or a 2.1-dimensional package, and stacked device structures typified by the above have been attracting attention (e.g., NON PATENT LITERATURE 1).

Among the stacked device structures, multi-die fanout wafer level packaging is a package manufactured by collectively sealing a plurality of dies in one package, and has been attracting much attention because lower cost and higher performance can be expected than in a conventional fanout wafer level package manufactured by sealing one die in one package.

However, in the manufacture of a multi-die fanout wafer level package, a heat treatment at more than 200° C. can not be conducted from the viewpoint of protecting a high-performance die, protecting a sealing material having low heat resistance, and improving yield. Thus, low-temperature curability is strongly demanded even for a polybenzoxazole precursor used as a rewiring formation layer for rewiring of copper (PATENT LITERATURE 3).

Even in the case of low-temperature curing at 200° C. or less, properties equal to or more than those at high-temperature curing are required for the rewiring formation layer. Specifically, in addition to having high resolution in order to perform fine patterning, having high chemical resistance and high adhesion properties is required.

Chemical resistance is needed to comply with a plating process of copper rewiring during multi-die fanout package production. Specifically, in a plating process, after copper plating using a resist for plating production, a resist stripping solution which is a strong chemical is used to remove the resist, and resistance to this chemical is required. Adhesion properties (properties of adhesion between the rewiring of copper and the rewiring formation layer) are extremely important from the viewpoint of ensuring reliability.

However, for the conventional resin composition for the rewiring formation layer (a positive-type photosensitive resin composition using a polybenzoxazole precursor), it is difficult to have high chemical resistance and adhesion properties when cured at a low temperature, and it has been impossible to comply with the production of the package.

PATENT LITERATURE 4 discloses that high sensitivity and high resolution are achieved by combining a specific crosslinking agent and a photosensitive agent with a polybenzoxazole precursor, but the properties of a cured film at low-temperature curing are low.

CITATION LIST

Patent Literature

[PATENT LITERATURE 1] Japanese Unexamined Patent Application Publication No. 2009-265520
[PATENT LITERATURE 2] International Publication No. 2014/115233 pamphlet
[PATENT LITERATURE 3] International Publication No. 2008/111470 pamphlet
[PATENT LITERATURE 4] Japanese Unexamined Patent Application Publication No. 2011-164289

Non Patent Literature

[NON PATENT LITERATURE 1] "Semiconductor technology yearbook 2013 packaging/mounting guide", Nikkei Business Publications, Inc., December 2012, pp. 41 to 50

SUMMARY OF INVENTION

An object of the present invention is to provide a positive-type photosensitive resin composition which has satisfactory chemical resistance even when cured at a low temperature of 200° C. or less.

As a result of repeated intensive studies in view of the above problems, the present inventors found that a combination of a particular photosensitive agent and a particular polybenzoxazole precursor exhibited satisfactory chemical resistance even when cured at a low temperature.

According to the present invention, the following positive-type photosensitive resin composition or the like is provided.
1. A positive-type photosensitive resin composition comprising a (a) polybenzoxazole precursor, a (b) crosslinking agent, a (c) photosensitive agent, and a (d) solvent, wherein
the (a) polybenzoxazole precursor comprises a structure represented by Formula (1) below, and
the (c) photosensitive agent is a compound comprising a structure represented by Formula (2) below.

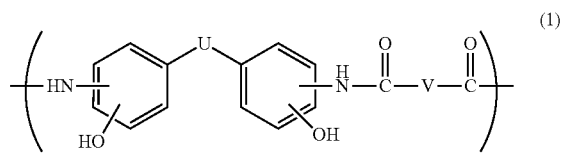

(In Formula (1), U is a bivalent organic group, a single bond, —O—, or —SO$_2$—, V is a group comprising an aliphatic structure, and the carbon number in the aliphatic structure is 1 to 30.)

2. The positive-type photosensitive resin composition according to 1, wherein the (b) crosslinking agent is represented by Formula (3) below.

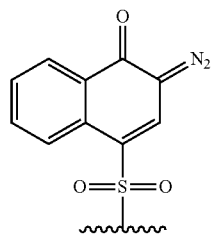

(In Formula (3), R$^3$ is independently a hydrogen atom or —CH$_2$—O—R$^4$, and at least one of the plurality of R$^3$s is —CH$_2$—O—R$^4$. R$^4$ is independently a hydrogen atom, a methyl group, an ethyl group, or a butyl group.)

3. The positive-type photosensitive resin composition according to 1 or 2, wherein the (b) crosslinking agent is represented by Formula (4) below.

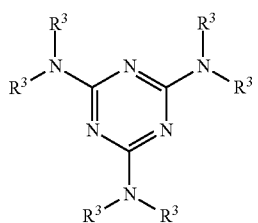

4. The positive-type photosensitive resin composition according to any one of 1 to 3, wherein the (c) photosensitive agent is represented by Formula (5) below.

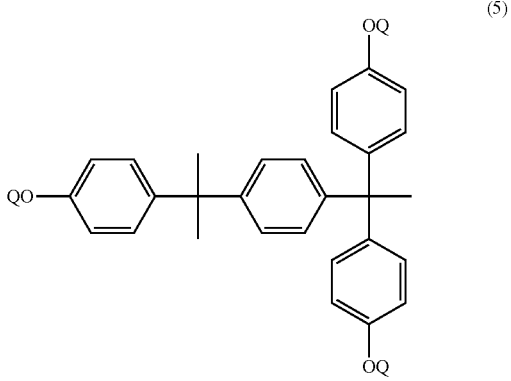

(In Formula (5), Q is independently a hydrogen atom or a group represented by Formula (6) below. At least one Q is a group represented by Formula (6) below.)

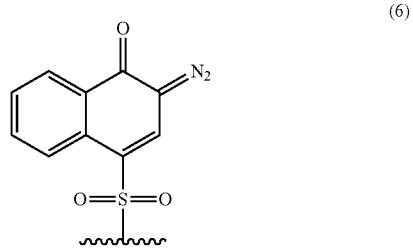

5. The positive-type photosensitive resin composition according to any one of 1 to 4, wherein the aliphatic structure of V in Formula (1) is an aliphatic straight-chain structure having 5 to 10 carbon atoms.

6. A method of manufacturing a pattern cured film, comprising:

coating the positive-type photosensitive resin composition according to any one of 1 to 5 on a substrate, drying the positive-type photosensitive resin composition, and thereby forming a photosensitive resin film;

exposing the photosensitive resin film to a predetermined pattern;

developing the exposed photosensitive resin film by use of an alkaline aqueous solution, and thereby forming a pattern resin film; and heat-treating the pattern resin film.

7. The method of manufacturing the pattern cured film according to 6, wherein in heat-treating the pattern resin film, a heat treatment temperature is 200° C. or less.

8. A cured product of the positive-type photosensitive resin composition according to any one of 1 to 5.

9. An interlayer insulating film, a cover coat layer, or a surface protection film using the cured product according to 8.

10. An electronic component comprising the interlayer insulating film, the cover coat layer, or the surface protection film according to 9.

According to the present invention, it is possible to provide a positive-type photosensitive resin composition which has satisfactory chemical resistance even when cured at a low temperature of 200° C. or less.

DESCRIPTION OF EMBODIMENTS

Figure 1:
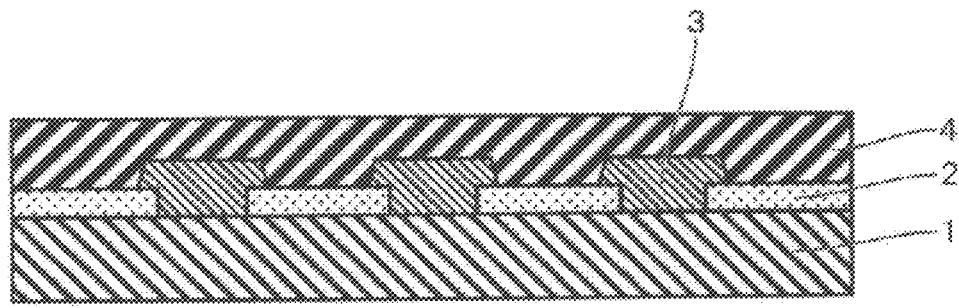
FIG. 1 is a schematic sectional view illustrating a part of a manufacturing process of a fanout package having a multilayer wiring structure.
Figure 2:
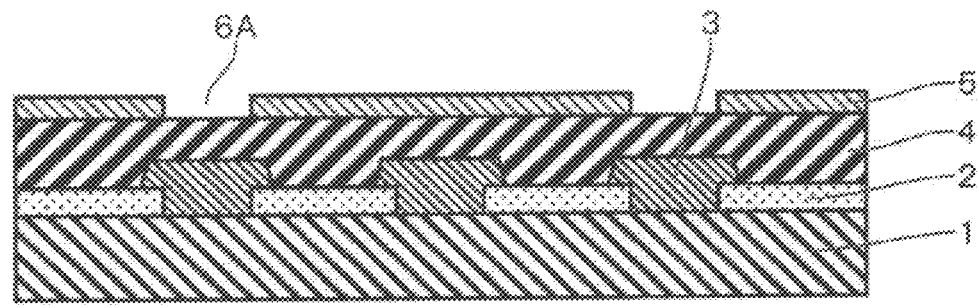
FIG. 2 is a schematic sectional view illustrating a part of the manufacturing process of the fanout package having the multilayer wiring structure.
Figure 3:
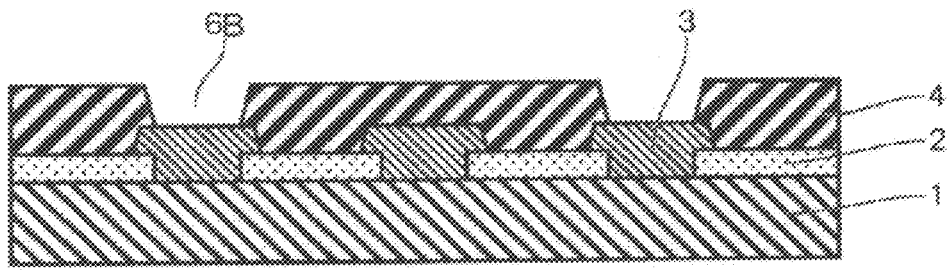
FIG. 3 is a schematic sectional view illustrating a part of the manufacturing process of the fanout package having the multilayer wiring structure.

Hereinafter, an embodiment of the present invention is described in detail. However, the present invention is not limited to the following embodiment. It is to be noted that in the present description, when "A or B" is mentioned, one of A and B has only to be included, or both A and B may be included. Further, in the present description, the term "step" includes not only an independent step, but also a step as long as a desired action of this step is achieved even when this step can not be clearly distinguished from other steps. A numerical range indicated by use of "to" refers to a range including numerical values described before and after "to" as minimum and maximum values, respectively. Moreover, in the present description, the content of each component in a composition, when a plurality of substances corresponding to each component are present in the composition, means the total amount of the plurality of substances present in the composition, unless otherwise specified. In addition, unless otherwise specified, the illustrated materials may be used singly or may be used in combination of two or more kinds.

[Positive-Type Photosensitive Resin Composition]

The positive-type photosensitive resin composition according to the present invention comprises a (a) polybenzoxazole precursor, a (b) crosslinking agent, a (c) photosensitive agent, and a (d) solvent, wherein the (a) polybenzoxazole precursor comprises a structure represented by Formula (1) below, and the (c) photosensitive agent is a compound comprising a structure represented by Formula (2) below.

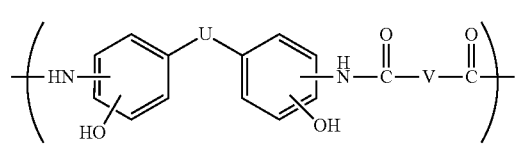

(1)

(In Formula (1), U is a bivalent organic group, a single bond, —O—, or —SO$_2$—, V is a group comprising an aliphatic structure, and the carbon number in the aliphatic structure is 1 to 30.)

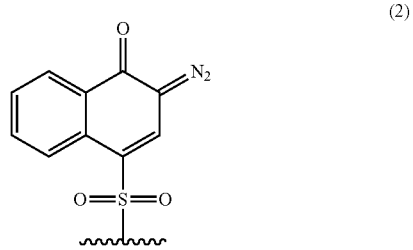

(2)

By comprising the above components, the positive-type photosensitive resin composition according to the present invention can form a pattern cured film having high chemical resistance equal to or more than that of a pattern cured film obtained at high-temperature curing, even when cured at a low temperature of 200° C. or less. Moreover, the positive-type photosensitive resin composition according to the present invention can form, with high sensitivity, a pattern having high resolution, and has satisfactory properties of adhesion to copper or the like. Thus, the positive-type photosensitive resin composition according to the present invention is suitably applicable to the production of a stacked device structure typified by a multi-die fanout wafer level package.

Each component is described below. Hereinafter, the (a) polybenzoxazole precursor, the (b) crosslinking agent, the (c) photosensitive agent, and the (d) solvent may be referred to as a (a) component, a (b) component, a (c) component, and a (d) component, respectively.

((a) Component: Polybenzoxazole Precursor)

The polybenzoxazole precursor is preferably a material having high transmittance of a light source (i-line) for use in patterning and showing high cured film properties even when cured at a low temperature of 200° C. or less. Thus, the polybenzoxazole precursor preferably comprises a structure represented by Formula (1) above.

V in Formula (1) is a group comprising an aliphatic structure (having 1 to 30 carbon atoms). In the present invention, the "aliphatic structure" comprises an alicyclic structure. The aliphatic structure is preferably an aliphatic chain structure, and more preferably an aliphatic straight-chain structure. The carbon number of the aliphatic structure is preferably 5 to 20, and more preferably 5 to 10.

V is preferably a structure derived from dicarboxylic acid. The raw material dicarboxylic acid giving V includes dodecanedioic acid, decanedioic acid, nonanedioic acid, cyclohexanedicarboxylic acid, 2,2-bis (4-carboxyphenyl)-1,1,1,3,3,3-hexafluoropropane, 5-tert-butylisophthalic acid, and the like. Particularly, from the viewpoint of achieving both ensuring of i-line transmittance and properties of the elongation at break of a cured film, dodecanedioic acid or decanedioic acid is preferable as a raw material dicarboxylic acid.

The polybenzoxazole precursor which is the (a) component may have, in a part thereof, a structural unit other than the structural unit represented by Formula (1). In this case, the proportion of the structural unit represented by Formula (1) to all the structural units is preferably 50 mol % or more, and more preferably 60 mol % or more.

The structural unit other than the structural unit represented by Formula (1) includes, a structural unit in which V is a skeleton derived from a diphenylether compound, and the like, for example, in Formula (1).

U is preferably a group comprising a structure represented by Formula (u-1) below.

In Formula (u-1), $R^1$ and $R^2$ are independently a hydrogen atom, a fluorine atom, an alkyl group having 1 to 6 carbon atoms, or a fluorinated alkyl group having 1 to 6 carbon atoms, and a is an integer of 1 to 30.

$R^1$ and $R^2$ specifically include a methyl group, a trifluoromethyl group, and the like. From the viewpoint of the transparency of the polybenzoxazole precursor, a trifluoromethyl group is preferable. a is preferably an integer of 1 to 5.

Polybenzoxazole is obtained by the hydration and ring closure of the above polybenzoxazole precursor.

The above polybenzoxazole precursor is usually developed with an alkaline aqueous solution. Therefore, the polybenzoxazole precursor is preferably soluble in the alkaline aqueous solution. The alkaline aqueous solution includes an organic ammonium aqueous solution such as a tetramethylammonium hydroxide (TMAH) aqueous solution, a metal hydroxide aqueous solution, an organic amine aqueous solution, and the like. In general, a TMAH aqueous solution having a concentration of 2.38 mass % is preferably used. That is, the (a) component is preferably soluble in the TMAH aqueous solution.

Incidentally, one standard for the (a) component to be soluble in the alkaline aqueous solution is described below. After the (a) component is dissolved into a given solvent resulting in a solution, a substrate such as a silicon wafer is spin-coated with the solution to form a resin film having a thickness of about 5 μm. This resin film is dipped in any one of the tetramethylammonium hydroxide aqueous solution, the metal hydroxide aqueous solution, and the organic amine aqueous solution at 20 to 25° C. When dissolved and resulting in a solution, the (a) component used is determined to be soluble in the alkaline aqueous solution.

The molecular weight of the (a) component preferably has a weight average molecular weight of 10,000 to 100,000 in terms of polystyrene, more preferably 15,000 to 100,000, and further preferably 20,000 to 85,000. When the weight average molecular weight of the (a) component is 10,000 or more, there is a tendency that suitable solubility into an alkaline developing solution can be ensured. Moreover, when the weight average molecular weight of the (a) component is 100,000 or less, there is a tendency that satisfactory solubility into a solvent is obtained, and there is a tendency that deterioration of handleability resulting from increased viscosity of the solution can be suppressed.

Further, dispersity in which the weight average molecular weight is divided by a number average molecular weight is preferably 1 to 4, and more preferably 1 to 3.

The weight average molecular weight can be measured by gel permeation chromatography, and can be found by conversion using a standard polystyrene calibration curve.

((b) Component: Crosslinking Agent)

The (b) component causes a reaction (crosslinking reaction) with the polybenzoxazole precursor which is the (a) component in a step of heat-treating a pattern resin film obtained by coating, exposing, and developing the positive-type photosensitive resin composition. Alternatively, the crosslinking agent which is the (b) component can be polymerized. Thus, even when the positive-type photosensitive resin composition is cured at a relatively low temperature of, for example, 200° C. or less, it is possible to provide satisfactory mechanical properties, such as chemical resistance and adhesion properties.

The (b) component is not particularly limited as long as the (b) component is a crosslinkable or polymerizable compound in the heat-treating step. However, the (b) component is preferably a compound having a hydroxyalkyl group such as a methylol group or an alkoxyalkyl group such as an alkoxymethyl group from the viewpoint of high reactivity at low-temperature curing.

Alkyl groups included in a hydroxyalkyl group and an alkoxyalkyl group include a methyl group, an ethyl group, a butyl group, and the like.

Among others, a compound having two or more hydroxyalkyl groups or alkoxyalkyl groups is more preferable from the viewpoint of satisfactory sensitivity, stability of varnish, and the fact that the melting of the photosensitive resin film can be prevented during the curing of the photosensitive resin film after pattern formation.

From the viewpoint of a low reaction temperature, it is particularly preferable to use a melamine resin in which a hydroxyalkyl group or an alkoxyalkyl group is substituted for an N-position, or a compound represented by Formula (3) below.

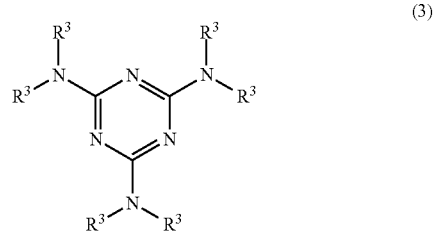

(In Formula (3), $R^3$ is independently a hydrogen atom or $—CH_2—O—R^4$, and at least one of the plurality of $R^3$s is $—CH_2—O—R^4$. $R^4$ is independently a hydrogen atom, a methyl group, an ethyl group, or a butyl group.)

It is preferable that 2 to 6 of the plurality of $R^3$s are $—CH_2—O—R^4$, and it is more preferable that all of $R^3$s are $—CH_2—O—R^4$. $R^4$ is preferably a methyl group.

A compound represented by Formula (4) below is the most preferable. With this compound, a cured film having satisfactory chemical resistance and adhesion properties is obtained when the positive-type photosensitive resin composition is cured at a low temperature of 200° C. or less.

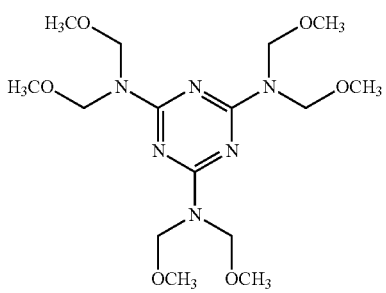

(4)

The content of the (b) component in the positive-type photosensitive resin composition according to the present invention is preferably 1 to 50 parts by mass with respect to 100 parts by mass of component (a), more preferably 5 to 30 parts by mass in order to ensure satisfactory mechanical properties, and further preferably 10 to 30 parts by mass from the viewpoint of achieving both mechanical properties and photosensitive properties.

((c) Component: Photosensitive Agent)

The positive-type photosensitive resin composition according to the present invention comprises, as the (c) component, a compound (diazonaphthoquinone compound) comprising a structure represented by Formula (2) below.

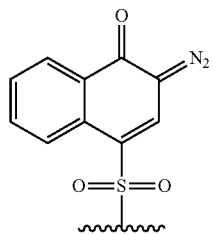

(2)

The (c) component is preferably represented by the Formula (2') below.

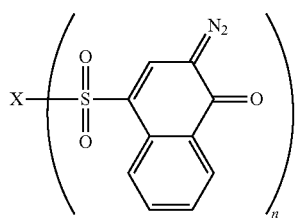

(2')

(in Formula (2'), n is an integer of 1 to 4. X is an a monovalent to tetravalent residue of a hydroxy-group-containing compound, or a monovalent to tetravalent residue of an amino-group-containing compound.)

The residue of the hydroxy-group-containing compound refers to a group obtained by removing a hydrogen atom of a hydroxy group from the compound. The residue of the amino-group-containing compound refers to a group obtained by removing a hydrogen atom of an amino group from the compound.

X in Formula (2') is preferably represented by Formula (11) below.

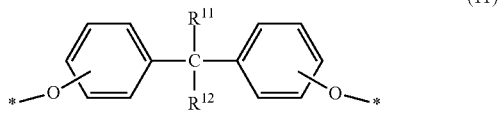

(11)

In Formula (11), $R^{11}$ and $R^{12}$ are independently represented by a hydrogen atom, an alkyl group having 1 to 6 carbon atoms, a fluorinated alkyl group having 1 to 6 carbon atoms, or a group represented by Formula (12) below.

(12)

In Formula (12), $R^{13}$ and $R^{14}$ are independently a hydrogen atom, an alkyl group having 1 to 6 carbon atoms, or a fluorinated alkyl group having 1 to 6 carbon atoms.

In Formulas (11) and (12), * is a position to bond with the structure within the brackets of Formula (2'). It is only necessary to bond with the structure in at least one *, or it is possible to bond with the structure in all *s.

The compound represented by Formula (2) is obtained by, for example, causing a condensation reaction between 1,2-naphthoquinone-2-diazide-4-sulfonyl chloride, and a hydroxy-group-containing compound, an amino-group-containing compound, or the like, in the presence of a dehydrochlorination agent.

The hydroxy-group-containing compound is not particularly limited, but from the viewpoint of enhancing a dissolution inhibiting effect in unexposed parts, is preferably hydroquinone, resorcinol, pyrogallol, bisphenol A, bis (4-hydroxyphenyl) methane, 2,2-bis (4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4', 5'-hexahydroxybenzophenone, bis (2,3,4-trihydroxyphenyl) methane, bis (2,3,4-trihydroxyphenyl) propane, 4b,5,9b,10-tetrahydro-1,3,6,8-tetrahydroxy-5,10-dimethyl-indeno [2,1-a] indene, tris(4-hydroxyphenyl) methane, and tris(4-hydroxyphenyl) ethane.

As the amino-group-containing compound, it is possible to use p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4, 4'-dihydroxybiphenyl, 4,4'-diamino-3,3'-dihydroxybiphenyl, bis (3-amino-4-hydroxyphenyl) propane, bis (4-amino-3-hydroxyphenyl) propane, bis (3-amino-4-hydroxyphenyl) sulfone, bis (4-amino-3-hydroxyphenyl) sulfone, bis (3-amino-4-hydroxyphenyl) hexafluoropropane, and bis (4-amino-3-hydroxyphenyl) hexafluoropropane.

1,2-naphthoquinone-2-diazide-4-sulfonylchloride, and the hydroxy-group-containing compound or the amino-group-containing compound are preferably blended so that the sum of the hydroxy group and the amino group is 0.5 to 1 equivalent of 1 mole of naphthoquinone-1,2-diazide-4-sulfonyl chloride.

A preferred ratio (molar ratio) between the dehydrochlorination agent and 1,2-naphthoquinone-2-diazide-4-sulfonylchloride ranges from 0.95/1 to 1/0.95. A preferred reaction temperature is 0 to 40° C. A preferred reaction time is 1 to 10 hours.

As a reaction solvent for the above reaction, it is possible to use dioxane, acetone, methyl ethyl ketone, tetrahydrofuran, diethyl ether, N-methylpyrrolidone, or the like.

As the dehydrochlorination agent, it is possible to use sodium carbonate, sodium hydroxide, sodium hydrogen carbonate, potassium carbonate, potassium hydroxide, trimethylamine, triethylamine, pyridine, or the like.

As the (c) component, it is particularly preferable to use a compound represented by Formula (5) below from the viewpoint of higher sensitivity and higher resolution.

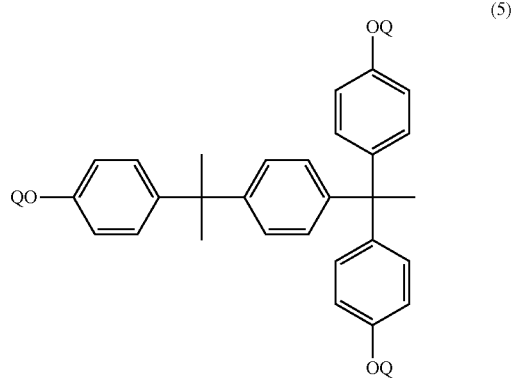

(5)

(in Formula (5), Q is independently a hydrogen atom or a group represented by Formula (6) below. At least one Q is a group represented by Formula (6) below.)

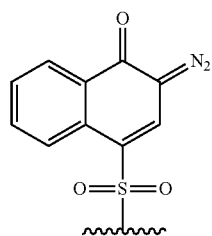

(6)

The content of the (c) component in the positive-type photosensitive resin composition according to the present invention needs only to be suitably adjusted in consideration of dissolution contrast and the like. However, especially in the case of a thick film, the diazonaphthoquinone compound itself has absorption for the i-line, so that when the (c) component is blended in a large amount, the i-line does not reach the bottom of the film, photoreaction becomes difficult due to insufficient exposure to the diazonaphthoquinone compound, and there is concern that an opening pattern can not be formed. Accordingly, the (c) component is preferably 1 to 20 parts by mass with respect to 100 parts by mass of the (a) component, and more preferably 5 to 15 parts by mass.

Further, the (c) component is preferably highly compatible with the (a) component from the viewpoint of film formability and higher sensitivity.

((d) Component: Solvent)

The (d) component includes γ-butyrolactone, ethyllactate, propyleneglycolmonomethyletheracetate, benzylacetate, n-butylacetate, ethoxyethylpropionate, 3-methylmethoxypropionate, N-methyl-2-pyrrolidone, N,N-dimethylformamide, N,N-dimethylacetamide, dimethylsulfoxide, hexamethylphosphorylamide, tetramethylenesulfone, cyclohexanone, cyclopentanone, diethylketone, diisobutylketone, methylamylketone, and the like. Normally, the (d) component is not particularly limited as long as other components in the photosensitive resin composition can be sufficiently dissolved.

Among the above, from the viewpoint of satisfactory solubility of each component and coating properties at the time of resin film formation, it is preferable to use γ-butyrolactone, ethyllactate, propyleneglycolmonomethyletheracetate, N-methyl-2-pyrrolidone, N,N-dimethylformamide, N,N-dimethylacetamide, or dimethylsulfoxide.

The content of the (d) component in the positive-type photosensitive resin composition according to the present invention is not particularly limited, but is preferably 50 to 300 parts by mass with respect to 100 parts by mass of the (a) component, and more preferably 100 to 200 parts by mass.

The positive-type photosensitive resin composition according to the present invention may consist essentially of the (a), (b), (c), and (d) components. For example, 80 mass % or more, 90 mass % or more, 95 mass % or more, or 98 mass % or more of the positive-type photosensitive resin composition according to the present invention may be the above (a), (b), (c), and (d) components. Alternatively, the positive-type photosensitive resin composition according to the present invention may consist of the (a), (b), (c), and (d) components alone. In this case, the composition may comprise inevitable impurities.

In addition to the above (a) to (d) components, the resin composition according to the present invention may comprise, if necessary, (1) a coupling agent, (2) a dissolution accelerator, (3) a dissolution inhibitor, and (4) an interfacial active agent, a leveling agent, or the like.

((1) Coupling Agent)

It is estimated that a coupling agent (compound different from the above (b) crosslinking agent) usually reacts to and thus crosslinks with the polybenzoxazole precursor which is the (a) component in the step of heat-treating after coating, exposing, and developing the positive-type photosensitive resin composition, or a coupling agent itself is polymerized in the step of heat-treating. Thus, it is possible to further improve the properties of adhesion between a cured film to be obtained and the substrate.

In the present invention, by using a silane coupling agent having a urea bond (—NH—CO—NH—) in a molecule in addition to the composition according to the present invention, it is possible to further increase the properties of adhesion to the substrate even when curing is conducted at a low temperature of 200° C. or less.

A preferred silane coupling agent includes a compound having a urea bond. For satisfactory development of adhesion properties when curing is conducted at a low temperature, a compound represented by the Formula (7) below is more preferable.

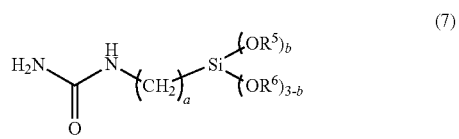

(7)

(in the formula, $R^5$ and $R^6$ are independently an alkyl group having 1 to 5 carbon atoms a is an integer of 1 to 10, and b is an integer of 1 to 3.)

Specific examples of the compound represented by formula (7) include ureidomethyltrimethoxysilane, ureidomethyltriethoxysilane, 2-ureidoethyltrimethoxysilane, 2-ureidoethyltriethoxysilane, 3-ureidopropyltrimethoxysilane, 3-ureidopropyltriethoxysilane, 4-ureidobutyltrimethoxysilane, 4-ureidobutyltriethoxysilane, and the like. 3-ureidopropyltriethoxysilane is preferable.

Further using a silane coupling agent having a hydroxy group or a glycidyl group in a molecule in addition to the above-described silane coupling agent having a urea bond in a molecule is effective in further improving properties of adhesion of the cured film to the substrate at low-temperature curing.

The silane coupling agent having a hydroxy group or a glycidyl group in a molecule includes methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropyl-methylphenylsilanol, n-butylmethylphenylsilanol, isobutylmethylphenylsilanol, tert-butylmethylphenylsilanol, ethyln-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis (trihydroxysilyl) benzene, 1,4-bis (methyldihydroxysilyl) benzene, 1,4-bis (ethyldihydroxysilyl) benzene, 1,4-bis (propyldihydroxysilyl) benzene, 1,4-bis (butyldihydroxysilyl) benzene, 1,4-bis (dimethylhydroxysilyl) benzene, 1,4-bis (diethylhydroxidesilyl) benzene, 1,4-bis (dipropylhydroxysilyl) benzene, 1,4-bis (dibutylhydroxysilyl) benzene, and the like, and a compound represented by the Formula (8) below.

(8)

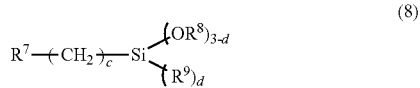

(in the formula, $R^7$ is a monovalent organic group having a hydroxy group or a glycidyl group, $R^8$ and $R^9$ are independently an alkyl group having 1 to 5 carbon atoms. c is an integer of 1 to 10, and d is an integer of 0 to 2.)

Among the above compounds, a compound represented by Formula (8) in particular further improves the properties of adhesion to the substrate, and is therefore preferable.

Such a silane coupling agent includes hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4-hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 4-glycidoxybutyltrimethoxysilane, 4-glycidoxybutyltrimethoxysilane, and the like.

The silane coupling agent having a hydroxy group or a glycidyl group in a molecule is preferably a group further comprising a nitrogen atom together with a hydroxy group or a glycidyl group, specifically, a silane coupling agent having an amino group and an amide bond.

The silane coupling agent having an amino group includes bis (2-hydroxymethyl)-3-aminopropyltriethoxysilane, bis (2-hydroxymethyl)-3-aminopropyltrimethoxysilane, bis (2-glycidoxymethyl)-3-aminopropyltriethoxysilane, bis (2-hydroxymethyl)-3-aminopropyltrimethoxysilane, and the like.

The silane coupling agent having an amide bond includes a silane coupling agent having an amide bond such as a compound represented by the formula below or the like.

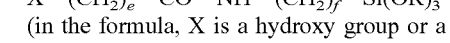
X—$(CH_2)_e$—CO—NH—$(CH_2)_f$—Si$(OR)_3$ (in the formula, X is a hydroxy group or a glycidyl group, e and f are independently an integer of 1 to 3, R is independently a methyl group, an ethyl group, or a propyl group.)

The content of the silane coupling agent when used is preferably 0.1 to 20 parts by mass with respect to 100 parts by mass of the (a) component, more preferably 0.3 to 10 parts by mass, and more preferably 1 to 10 parts by mass.

((2) Dissolution Accelerator)

A dissolution accelerator may be added in order to further accelerate the solubility of (a) polybenzoxazole precursor in an alkaline aqueous solution. The dissolution accelerator includes, for example, a compound having a phenolic hydroxyl group. By being added to the photosensitive resin composition, the compound having a phenolic hydroxyl group increases the dissolution rate of an exposed part at the time of development using an alkaline aqueous solution, and can prevent the melting of the photosensitive resin film when the photosensitive resin film is cured after pattern formation.

The compound having a phenolic hydroxyl group is not particularly limited, but is preferably a compound having a relatively small molecular weight. Such a compound includes o-cresol, m-cresol, p-cresol, 2,4-xylenol, 2,5-xylenol, 2,6-xylenol, bisphenol A, B, C, E, F, and G, 4,4',4"-methylidyne tris phenol, 2,6-[(2-hydroxy-5-methylphenyl) methyl]-4-methylphenol, 4,4'-[1-[4-[1-(4-hydroxyphenyl)-1-methylethyl]phenyl]ethylidene] bisphenol, 4,4'-[1-[4-[2-(4-hydroxyphenyl)-2-propyl]phenyl]ethylidene] bisphenol, 4,4',4"-ethylidyne tris phenol, 4-[bis (4-hydroxyphenyl) methyl]-2-ethoxy phenol, 4,4'-[(2-hydroxyphenyl methylene) bis [2,3-dimethylphenol], 4,4'-[(3-hydroxyphenyl) methylene] bis [2,6-dimethylphenol], 4,4'-[(4-hydroxyphenyl) methylene] bis [2,6-dimethylphenol], 2,2'-[(2-hydroxyphenyl) methylene] bis [3,5-dimethylphenol], 2,2'-[(4-hydroxyphenyl) methylene] bis [3,5-dimethylphenol], 4,4'-[(3, 4-dihydroxyphenyl) methylene] bis [2,3,6-trimethylphenol], 4-[bis (3-cyclohexyl-4-hydroxy-6-methylphenyl) methyl]-1, 2-benzenediol, 4,6-bis [(3,5-dimethyl-4-hydroxyphenyl) methyl]-1,2,3-benzentriol, 4,4'-[(2-hydroxyphenyl) methylene] bis [3-methylphenol], 4,4',4"-(3-methyl-1-propanyl-3-ylidine) trisphenol, 4,4', 4", 4"'-(1,4-phenylene dimethylidyne) tetrakis phenol, 2,4,6-tris [(3,5-dimethyl-4-hydroxyphenyl) methyl]-1,3-benzenediol, 2,4,6-tris [(3,5-dimethyl-2-hydroxyphenyl) methyl]-1,3-benzenediol, 4,4'-[1-[4-[1-(4-hydroxyphenyl)-3,5-bis [(hydroxy-3-methylphenyl)methyl]phenyl]-phenyl]ethylidene] bis [2,6-bis (hydroxy-3-methylphenyl)methyl] phenol, and the like.

The content of the dissolution accelerator when used is preferably 1 to 30 parts by mass with respect to 100 parts by mass of the (a) component from the viewpoint of a development time and sensitivity, and is more preferably 3 to 25 parts by mass.

((3) Dissolution Inhibitor)

A dissolution inhibitor which is a compound that inhibits the solubility of the (a) polybenzoxazole precursor in an alkaline aqueous solution can be contained. The dissolution inhibitor serves to adjust the residual film thickness and the development time by inhibiting the solubility of the (a) component. On the other hand, because acid that is generated easily volatilizes, it is considered that the dissolution inhibitor is not involved in the cyclodehydration reaction of the polybenzoxazole precursor.

A compound that can be used as a dissolution inhibitor is preferably diphenyliodonium nitrate, bis (p-tert-butylphenyl) iodonium nitrate, diphenyliodonium bromide, diphenyliodonium chloride, diphenyliodonium salts such as diphenyliodonium iodide.

The compounding amount of the dissolution inhibitor when used is preferably 0.01 to 50 parts by mass with respect to 100 parts by mass of (a) component from the viewpoint of sensitivity and a development time, more preferably 0.01 to 30 parts by mass, and further preferably 0.1 to 20 parts by mass.

((4) Interfacial Active Agent or Leveling Agent)

Furthermore, the photosensitive resin composition according to the present invention may additionally comprise an interfacial active agent or a leveling agent in order to improve coatability (e.g. inhibition of striation (unevenness of thickness)) and developability.

The interfacial active agent or the leveling agent includes, for example, polyoxyethyleneurarilether, polyoxyethylenestearylether, polyoxyethyleneoleylether, polyoxyethyleneoctylphenolether, and the like. Examples of commercially available products include trade names "Megafax F171", "F173", and "R-08" (which are manufactured by Dainippon Ink and Chemicals, Inc.), trade names "Fluorad FC430" and "FC431" (which are manufactured by Sumitomo 3M Limited), trade names "organosiloxane polymer KP341", "KBM303", "KBM403", and "KBM803" (which are manufactured by Shin-Etsu Chemical Co., Ltd.), and the like.

The content of the interfacial active agent or the leveling agent when used is preferably 0.01 to 10 parts by mass with respect to 100 parts by mass of the (a) component, more preferably 0.05 to 5 parts by mass, and further preferably 0.05 to 3 parts by mass.

[Method of Manufacturing Pattern Cured Film]

A method of manufacturing a pattern cured film according to the present invention comprises: a step (resin film forming step) of coating the positive-type photosensitive resin composition on a substrate, drying the positive-type photosensitive resin composition, and thereby forming a photosensitive resin film; a step (exposure step) of exposing the photosensitive resin film to a predetermined pattern; a step (development step) of developing the exposed photosensitive resin film by use of an alkaline aqueous solution, and thereby forming a pattern resin film; and a step (heat treatment step) of heat-treating the pattern resin film.

Each step is described below.

(Resin Film Forming Step)

The substrate includes glass, semiconductor, a metal oxide insulator such as $TiO_2$ and $SiO_2$, silicon nitride, copper, a copper alloy, and the like. While there is no particular limitation on the coating method, a spinner or the like can be used for coating.

Drying can be conducted by use of a hot plate, an oven, or the like. A heating temperature is preferably 90 to 150° C., and more preferably 90 to 120° C. in order to inhibit the reaction between the (a) component and the (b) component from the viewpoint of ensuring dissolution contrast. A heating time is preferably 30 seconds to 5 minutes. Thus, it is possible to obtain a resin film in which the above-described resin composition is formed into a film shape.

The thickness of the resin film is preferably 5 to 100 µm, more preferably 8 to 50 µm, and further preferably 10 to 30 µm.

(Exposure Step)

In the exposure step, the photosensitive resin film can be exposed to a predetermined pattern via a mask. Active rays to be applied include ultraviolet rays comprising an i-line, visible rays, radiation rays, and the like, but are preferably the i-line. As an exposure device, it is possible to use a parallel exposure machine, a projection exposure machine, a stepper, a scanner exposure machine, or the like.

(Development Step)

By performing a development treatment, it is possible to obtain a resin film in which a pattern is formed (pattern resin film). Generally, when a positive type photosensitive resin composition is used, the exposed part is removed with a developing solution.

An alkaline aqueous solution used as the developing solution includes sodium hydroxide, potassium hydroxide, sodium silicate, ammonia, ethylamine, diethylamine, triethylamine, triethanolamine, tetramethylammonium hydroxide, and the like. Tetramethylammonium hydroxide is preferable.

The concentration of the alkaline aqueous solution is preferably 0.1 to 10 mass %.

The development time varies depending on the kind of (a) component used, but is preferably 10 seconds to 15 minutes, more preferably 10 seconds to 5 minutes, and further preferably 30 seconds to 4 minutes from the viewpoint of productivity.

An alcohol or an interfacial active agent may be added to the above developing solution. The addition amount is preferably 0.01 to 10 parts by mass with respect to 100 parts by mass of the developing solution, and more preferably 0.1 to 5 parts by mass.

(Heat Treatment Step)

By heat-treating the pattern resin film, it is possible to form a crosslinked structure between the functional groups of the (a) component, between the (a) component and the (b) component, or the like, and obtain a pattern cured film. Moreover, the (a) component is a polybenzoxazole precursor, and can therefore cause a dehydration ring-closing reaction by the heat treatment step, and can be corresponding polybenzoxazole.

The heating temperature is not particularly limited, but is preferably 250° C. or less, more preferably 230° C. or less, and further preferably 200° C. or less. Moreover, the lower limit value of the heating temperature is not particularly limited either, but is preferably 120° C. or more, and more preferably 160° C. or more. Within the above range, it is possible to hold down the damage to the substrate or the device, produce the device with a satisfactory yield, and achieve energy saving of a process.

The heating time is preferably 5 hours or less, and more preferably 30 minutes to 3 hours.

Within the above range, it is possible to sufficiently carry out a crosslinking reaction or a dehydration ring-closing reaction. Moreover, the atmosphere of the heat treatment may be atmospheric air or inert atmosphere of nitrogen or the like, but is preferably nitrogen atmosphere from the viewpoint of being able to prevent the oxidation of the pattern resin film.

The device used for the heat treatment step includes a quartz tube furnace, a hot plate, rapid thermal annealing, a vertical diffusion furnace, an infrared curing oven, an electron beam curing oven, a microwave curing oven, and the like.

[Cured Product]

The cured product according to the present invention is a cured product of the positive-type photosensitive resin composition according to the present invention, and can be a cured product by applying the heat treatment step described above for the positive-type photosensitive resin composition according to the present invention.

The cured product according to the present invention may be the pattern cured film described above, or may be a cured film having no pattern.

[Electronic Component]

The pattern cured film and the cured product manufactured by the method described above can be used as an interlayer insulating film, a cover coat layer, or a surface protection film. By use of the interlayer insulating film, the cover coat layer, the surface protection film, or the like, it is possible to manufacture a highly reliable electronic component such as a semiconductor device, a multilayer wiring board, and various electronic devices.

[Process of Manufacturing Semiconductor Device]

Figure 8:
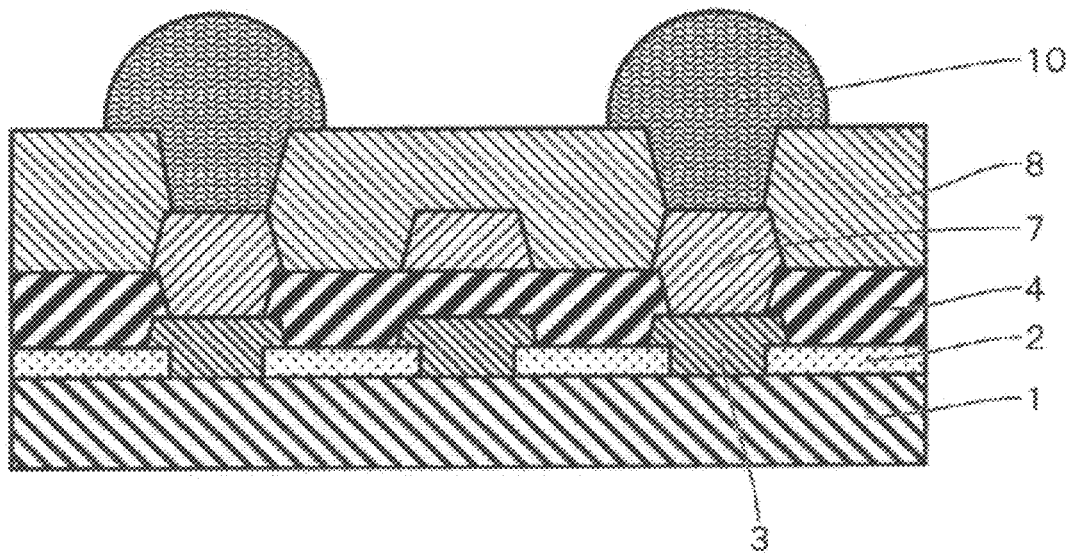
FIG. 8 is a schematic sectional view of a fanout package having an under bump metal (UBM) free structure.

As an example of a process of manufacturing a pattern cured film according to the present invention, a process of manufacturing a semiconductor device is described with reference to the drawings. FIGS. 1 to 7 are schematic sectional views illustrating a process of manufacturing a fanout package having a multilayer wiring structure, and represent a series of steps from a first step to a seventh step. FIG. 8 is a schematic sectional view of a fanout package having an under bump metal (UBM) free structure.

In these drawings, a semiconductor substrate 1 such as an Si substrate having a circuit element (not shown) is covered with a protection film 2 such as a silicon oxide film except for predetermined parts of the circuit element, and a first conductor layer 3 is formed on the exposed circuit element.

A film of a polyimide resin or the like as an interlayer insulating film 4 is formed on the semiconductor substrate by a spin coat method or the like (first step, FIG. 1).

Next, a photosensitive resin layer 5 based on chlorinated rubber, phenol novolak, or the like is formed on the interlayer insulating film 4 by the spin coat method. Using the photosensitive resin layer 5 as a mask, a window 6A is provided by a known method so that the interlayer insulating film 4 in the predetermined parts is exposed (second step, FIG. 2). The interlayer insulating film 4 exposed in the window 6A part is selectively etched by dry etching means using a gas such as oxygen or carbon tetrafluoride, and a window 6B is formed. Then, the photosensitive resin layer 5 is completely removed by use of an etching solution such that the first conductor layer 3 exposed from the window 6B is not corroded and the photosensitive resin layer 5 is only corroded (third step, FIG. 3).

Figure 4:
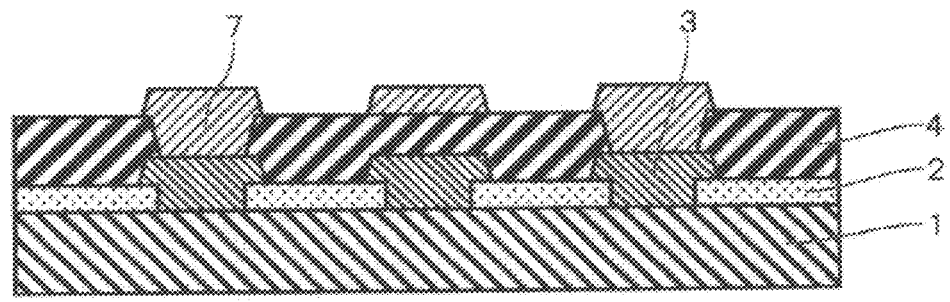
FIG. 4 is a schematic sectional view illustrating a part of the manufacturing process of the fanout package having the multilayer wiring structure.
Figure 5:
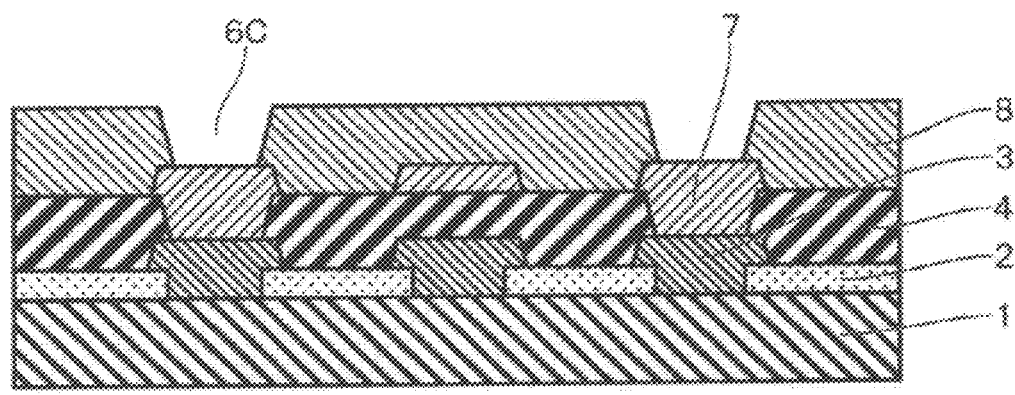
FIG. 5 is a schematic sectional view illustrating a part of the manufacturing process of the fanout package having the multilayer wiring structure.
Figure 6:
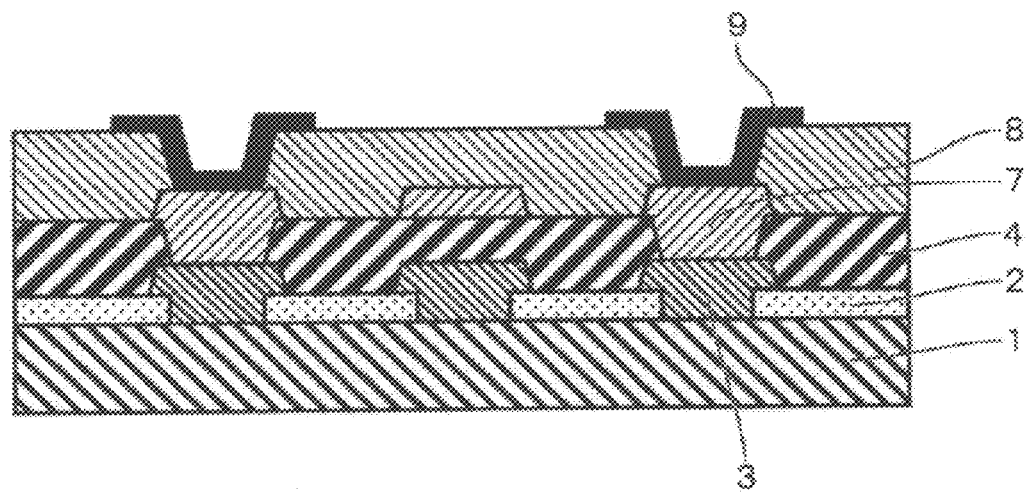
FIG. 6 is a schematic sectional view illustrating a part of the manufacturing process of the fanout package having the multilayer wiring structure.
Figure 7:
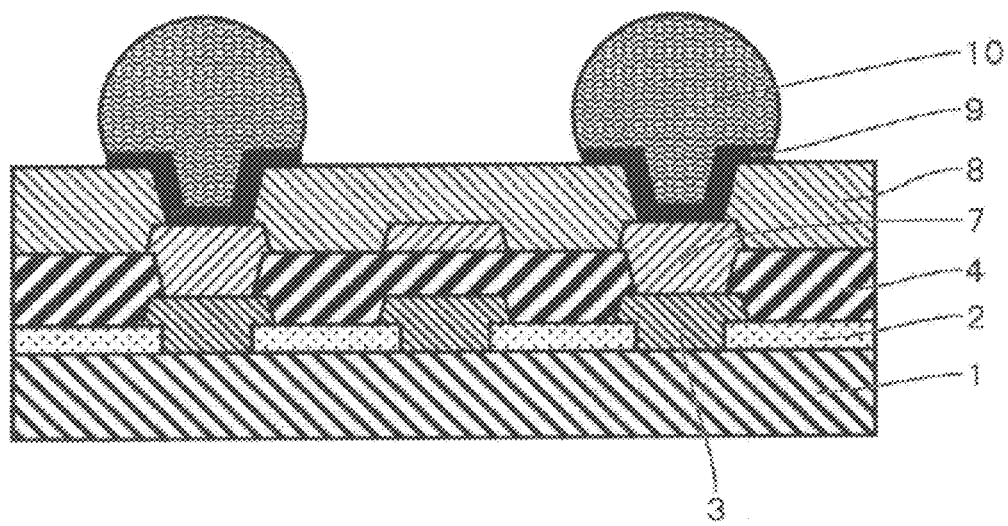
FIG. 7 is a schematic sectional view illustrating a part of the manufacturing process of the fanout package having the multilayer wiring structure.

Further, by use of a known method, a second conductor layer 7 is formed, and electrically connected to the first conductor layer 3 (fourth step, FIG. 4). When a multilayer wiring structure having three or more layers is formed, the steps described above are repeated, and each layer is formed.

Next, a surface protection film 8 is formed by use of the positive-type photosensitive resin composition according to the present invention as below. That is, the resin composition of the present invention is subjected to coating by a spin coat method, dried, irradiated with light from above a mask having a pattern drawn to form a window 6C in a predetermined part, and then developed with an alkaline aqueous solution, whereby a pattern resin film is formed. Thereafter, this pattern resin film is heated, and thus used as a pattern cured film of polybenzoxazole serving as the surface protection film 8 (fifth step, FIG. 5). This surface protection film (pattern cured film of polybenzoxazole) 8 functions to protect the conductor layer from external stress, α-rays, and the like.

Furthermore, normally, after a metal thin film is formed on the surface of the surface protection film 8 by a sputtering process, a plating resist is formed in accordance with the window 6C by use of a known method, and a metal layer 9 called an under bump metal (UBM) is precipitated in an exposed metal thin film portion by plating. Then, the plating resist is stripped, and a metal foil film in a part other than the area where the UBM 9 is formed is removed by etching to form a UBM (sixth step, FIG. 6). Further, an external connection terminal 10 called a bump is formed on the surface of the metal layer 9 (seventh step, FIG. 7). The metal layer 9 is formed for the purpose of easing stress acting on the bump 10 and improving electrical connection reliability.

In recent years, from the viewpoint of manufacturing cost reduction, there has been suggested a UBM free structure in which in order to omit the step of forming such a metal layer 9 (UBM), the bump 10 is directly formed after the window 6C is formed in the surface protection film 8. In the UBM free structure, in order to suppress an electrical resistance increase due to the generation of an intermetallic compound, it is necessary that the second conductor layer 7 to be connected to the bump 10 be formed with a larger thickness than usual. Moreover, it is necessary that the stress acting on the bump 10 be eased by the surface protection film 8 alone. Thus, it is necessary to form a thicker surface protection film 8 in order to cover the second conductor layer 7 formed with a large thickness, and enhance stress relaxation performance (FIG. 8).

Therefore, in the UBM free structure, when the window 6C is formed in the previously described surface protection film 8, it is necessary to coat with a thicker resin film, and expose and develop the resin film.

EXAMPLES

Hereinafter, the present invention is more specifically described on the basis of Examples and Comparative Examples. It is to be noted that the present invention is not limited to Examples below.

Synthesis Example 1

[(a) Component: Synthesis of Polybenzoxazole Precursor (Polymer I)]

60 g of N-methylpyrrolidone was fed into a flask of 0.2 liters equipped with a stirrer and a thermometer, and 13.92 g (38 mmol) of 2,2-bis (3-amino-4-hydroxyphenyl) hexafluoropropane was added and dissolved by stirring. Further, while the temperature was maintained at 0 to 5° C., 7.48 g (28 mmol) of dodecanedioic acid dichloride and 3.56 g (12 mmol) of 4,4'-diphenylether dicarboxylic acid dichloride were dropped for 10 minutes, and then the solution in the flask was stirred for 60 minutes. The above-described solution was poured into 3 liters of water, a precipitate was collected, and a resultant product was washed with pure water three times and then depressurized, whereby a polybenzoxazole precursor comprising the structure represented by Formula (1) was obtained (hereinafter, referred to as a polymer I). The weight average molecular weight of the polymer I was found to be 42,000 by gel permeation chromatography (GPC) in terms of standard polystyrene, and the dispersity thereof was 2.0.

It is to be noted that the weight average molecular weight by the GPC was measured by use of a solution including 1 ml of a solvent [tetrahydrofuran (THF)/dimethylformamide (DMF)=1/1 (volume ratio)] to 0.5 mg of a polymer.

A measurement device and measurement conditions are as below.

<Measurement Device>
Detector: L4000 manufactured by Hitachi, Ltd.
UV Pump: L6000 manufactured by Hitachi, Ltd.
C-R4A manufactured by Shimadzu Corporation Chromatopac column: Gelpack GL-S300MDT-5×2 manufactured by Hitachi Chemical Co., Ltd.
<Measurement Conditions>
Eluent: THF/DMF=1/1 (volume ratio)
LiBr (0.03 mol/l), $H_3PO_4$ (0.06 mol/l)
Flow rate: 1.0 ml/min
Detector: UV270 nm Synthesis Example 2

[(a) component: synthesis of polybenzoxazole precursor (polymer II)]

7.48 g (28 mmol) of dodecanedioic acid dichloride and 3.56 g (12 mmol) of 4,4'-diphenylether dicarboxylic acid dichloride used in Synthesis Example 1 were replaced by decanedioic acid dichloride (40 mmol). Except for the above, synthesis was conducted as in Synthesis Example 1, and a polybenzoxazole precursor comprising the structure represented by Formula (1) was obtained (hereinafter, referred to as a polymer II). The weight average molecular weight of the polymer II was 38,000, and the dispersity thereof was 2.0.

Synthesis Example 3

[(a') Component: Synthesis of Polybenzoxazole Precursor (Polymer III)]

60 g of N-methylpyrrolidone was fed into a flask of 0.2 liters equipped with a stirrer and a thermometer, and 13.92 g (38 mmol) of 2,2-bis (3-amino-4-hydroxyphenyl) hexafluoropropane was added and dissolved by stirring. Then, while the temperature was maintained at 0 to 5° C., 11.86 g (40 mmol) of 4,4'-diphenylether dicarboxylic acid dichloride was dropped for 10 minutes. Thereafter, the temperature was returned to room temperature, and the solution in the flask was stirred for 3 hours. The above-described solution was poured into 3 liters of water, a precipitate was collected, and a resultant product was washed with pure water three times and then depressurized, whereby a polybenzoxazole precursor was obtained (hereinafter, referred to as a polymer III). The weight average molecular weight of the polymer III was 22,400, and the dispersity thereof was 3.2.

Examples 1 to 9, Comparative Examples 1 to 5

[Preparation of Positive-Type Photosensitive Resin Composition]

The positive-type photosensitive resin compositions according to Examples 1 to 9 and Comparative Examples 1 to 5 were prepared in accordance with the components and the compounding amounts shown in Table 1. The compounding amounts shown in Table 1 are the parts by mass of the (b) to (d), and (c') components with respect to 100 parts by mass of each polymer which is the (a) component and/or (a') component.

Each component used is as below.
<(a) Component: Polybenzoxazole Precursor>
Polymer I: Polymer I Obtained in Synthesis Example 1
Polymer II: Polymer II Obtained in Synthesis Example 2
[(a') Component: Polybenzoxazole Precursor]
Polymer III: Polymer III Obtained in Synthesis Example 3

[(b) Component: Crosslinking Agent]
(b-1): Compound Represented by the Structural Formula Below (Manufactured by Sanwa Chemical Co., Trade Name: NIKALAC MW-390)

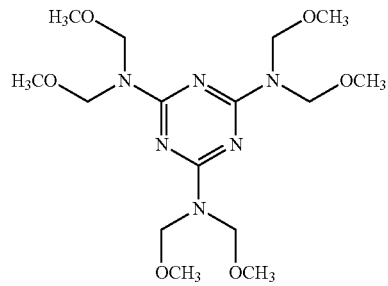 [SMILES: COCN(COC)c1nc(N(COC)COC)nc(N(COC)COC)n1]

(b-2): Compound Represented by the Structural Formula Below (Manufactured by SANWA CHEMICAL CO., LTD., Trade Name "NIKALAC MX-270")

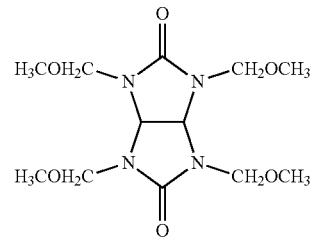

[(c) Component: Photosensitive Agent]
(c-1): compound represented by the structural formula below (manufactured by Daito Chemix Corporation, trade name: TPPA428)

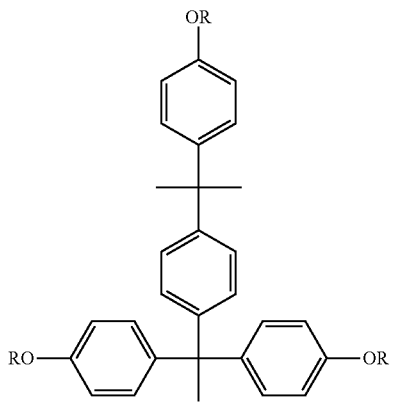

-continued

R = 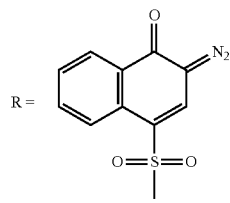

[(c') Component: Photosensitive Agent]

(c-2): compound represented by the structural formula below (manufactured by Daito Chemix Corporation, trade name: TPPA528)

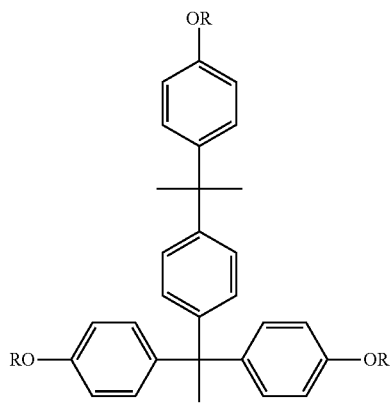

R = 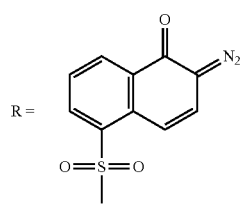

[(d) Component: Solvent]

BLO: γ-Butyrolactone

[Evaluation of Positive-Type Photosensitive Resin Composition]

For the positive-type photosensitive resin compositions obtained in Examples 1 to 9 and Comparative Examples 1 to 5, sensitivity, resolution, adhesion properties, and chemical resistance were evaluated in the manners shown below, respectively. The results are shown in Table 1.

<Evaluation of Sensitivity>

A silicon wafer was spin-coated with the obtained positive-type photosensitive resin composition by use of a coating apparatus (manufactured by Tokyo Electron Co., Ltd., trade name: CLEAN TRACK ACT8), and the positive-type photosensitive resin composition was dried for 3 minutes at 110° C., whereby a resin film having a thickness of 12 μm was formed. The obtained resin film was exposed by use of an i-line stepper (manufactured by Canon Inc., trade name: FPA-3000iW). After the exposure, the resin film was developed at 23° C. with 2.38 mass % of an aqueous solution of tetramethylammonium hydroxide (TMAH) until the residual film ratio in an unexposed part became about 75%. Then the resin film was rinsed with water, and a pattern resin film was obtained. The exposure amount when an exposure unit was opened was used as sensitivity, an evaluation was made as below by the exposure amount. Less than 200 mJ/cm$^2$: A 200 mJ/cm$^2$ or more and less than 230 mJ/cm$^2$: B 230 mJ/cm$^2$ or more and Jess than 250 mJ/cm$^2$: C 250 mJ/cm$^2$ or more: D <Evaluation of Resolution>

Used as resolution was the minimum line width at which a pattern of a line-and-space portion could be patterned without detachment and residue regarding the pattern resin film obtained by exposure with the i-line stepper in a manner similar to that in the evaluation of sensitivity described above.

<Evaluation of Adhesion Properties>

A copper wafer was spin-coated with the obtained positive-type photosensitive resin composition by use of a coating apparatus (manufactured by Tokyo Electron Co., Ltd., trade name "CLEAN TRACK ACT8"), and the positive-type photosensitive resin composition was dried for 3 minutes at 110° C., whereby a resin film having a thickness of 10 μm was formed. The obtained resin film was heated for one hour at 175° C. under nitrogen atmosphere by use of a vertical diffusion furnace μ-TF (manufactured by Koyo Thermo Systems Co., Ltd.), and a cured film (having a thickness of 8 μm after cured) was obtained.

The obtained cured film was put in a pressure cooker (PCT) apparatus, and treated under the conditions of 121° C., 2 atm, and RH of 100% for 100 hours (PCT treatment). Thereafter, a cross cut test was performed on the cured film, and properties of adhesion to the copper wafer were evaluated. The cross cut test was performed as below. First, eleven parallel lines were drawn at intervals of 1 mm in each of the orthogonal vertical and horizontal directions by use of a cutter guide in the center of the surface of the cured film on the copper wafer, and grid-pattern cuts were made so that 100 square cured films of 1 mm square were formed within 1 cm$^2$. Then a peeling test using a cellophane tape was performed on the grid pattern, and the number of cured films of 1 mm square remaining on the copper wafer after the test was counted. The case with 100 remaining cured films was evaluated as A, the case with 50 to 99 remaining cured films was evaluated as B, and the case with 49 or more remaining cured films was evaluated as C.

<Evaluation of Chemical Resistance>

A silicon wafer was spin-coated with the obtained positive-type photosensitive resin composition by use of a coating apparatus (manufactured by Tokyo Electron Co., Ltd., trade name: CLEAN TRACK ACT8), and the positive-type photosensitive resin composition was dried for 3 minutes at 110° C., whereby a resin film having a dry film thickness of 12 μm was formed. The obtained resin film was subjected to exposure 1.2 times that in the above-described evaluation of sensitivity by use of an i-line stepper (manufactured by Canon Inc., trade name: FPA-3000iW), and developed until the residual film ratio in an unexposed part became about 75%. Thus, a pattern resin film was obtained.

The pattern resin film obtained as described above was heated for one hour at 200° C. under nitrogen atmosphere by use of a vertical diffusion furnace μ-TF (manufactured by Koyo Thermo Systems Co., Ltd.), and a pattern cured film was obtained. The obtained pattern cured film was dipped in a resist stripping solution (manufactured by Dynaloy, LLC, trade name: Dynastrip 7700) for 120 minutes at 70° C., and the surface of the pattern cured film was then observed with an optical microscope. From the difference in film thickness before and after dipping in the chemical solution, a pattern cured film having a thickness change of less than 5% due to dipping was evaluated as A, a pattern cured film having a thickness change of 5% or more and less than 10% was evaluated as B, and a pattern cured film having a thickness change of 10% or more was evaluated as C. Further, a pattern cured film in which the resist stripping solution was impregnated in the pattern portion, and a pattern cured film in which the pattern portion was stripped due to the dipping were evaluated as D (not a practical level).

TABLE 1

|  |  | Examples |  |  |  |  |  |  |  |  | Comparative Examples |  |  |  |  |
|---|---|---|---|---|---|---|---|---|---|---|---|---|---|---|---|
|  |  | 1 | 2 | 3 | 4 | 5 | 6 | 7 | 8 | 9 | 1 | 2 | 3 | 4 | 5 |
| (a) component | Polymer I | 100 | 100 | 100 | 100 | 100 | 100 | 90 | 0 | 100 | 0 | 100 | 0 | 50 | 50 |
|  | Polymer II | 0 | 0 | 0 | 0 | 0 | 0 | 0 | 100 | 0 | 0 | 0 | 0 | 0 | 0 |
| (a') component | Polymer III | 0 | 0 | 0 | 0 | 0 | 0 | 10 | 0 | 0 | 100 | 0 | 100 | 50 | 50 |
| (b) component | b-1 | 25 | 20 | 30 | 12 | 20 | 20 | 25 | 25 | 0 | 25 | 0 | 0 | 0 | 0 |
|  | b-2 | 0 | 0 | 0 | 12 | 5 | 0 | 0 | 0 | 25 | 0 | 25 | 20 | 15 | 25 |
| (c) component | c-1 | 10 | 10 | 10 | 10 | 10 | 15 | 10 | 10 | 10 | 10 | 0 | 0 | 0 | 0 |
| (c') component | c-2 | 0 | 0 | 0 | 0 | 0 | 0 | 0 | 0 | 0 | 0 | 10 | 10 | 10 | 10 |
| (d) component | BLO | 160 | 160 | 160 | 160 | 160 | 160 | 160 | 160 | 160 | 160 | 160 | 160 | 160 | 160 |
|  | Sensitivity | A | A | B | A | A | A | B | A | A | B | C | D | D | D |
|  | Resolution (um) | 2 | 2 | 2 | 2 | 2 | 2 | 2 | 2 | 5 | 5 | 5 | 5 | 5 | 5 |
|  | Adhesion properties | A | A | A | A | A | A | B | A | C | C | C | C | C | C |
|  | Chemical resistance | A | A | A | A | A | A | A | A | B | D | D | D | D | C |

From Table 1, it can be seen that the positive-type photosensitive resin compositions according to Examples 1 to 8 have satisfactory sensitivity and resolution. It can also be seen that the positive-type photosensitive resin compositions according to Examples 1 to 8 have satisfactory adhesion properties even when cured at a low temperature of 175° C., and have satisfactory chemical resistance even when cured at a low temperature of 200° C. Furthermore, Example 9 is a system only using (b-2) as the (b) component, but it can be seen that Example 9 has favorable sensitivity and chemical resistance as compared with Comparative Examples. On the other hand, it can be seen that Comparative Examples 1 to 5 have poor chemical resistance.

INDUSTRIAL APPLICABILITY

The photosensitive resin composition according to the present invention can be used in a semiconductor device, a multilayer wiring board, and an electronic component such as various electronic devices.

While several embodiments and/or examples according to the present invention have been described above in detail, those skilled in the art can easily make numerous modifications to these illustrative embodiments and/or examples substantially without departing from the novel teachings and advantages of the present invention. Thus, these numerous modifications fall within the scope of the present invention.

The entire contents of the documents described in this description are incorporated herein by reference.

The invention claimed is:

1. A positive-type photosensitive resin composition comprising a (a) polybenzoxazole precursor, a (b) crosslinking agent, a (c) photosensitive agent, and a (d) solvent, wherein
   the (a) polybenzoxazole precursor comprises a structure represented by Formula (1) below,
   the (b) crosslinking agent is represented by Formula (3) below, and
   the (c) photosensitive agent is a compound comprising a structure represented by Formula (2) below,

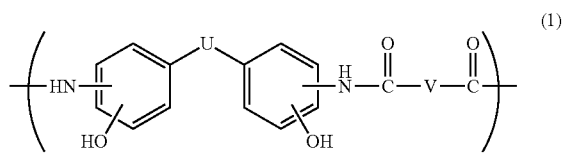

wherein, in Formula (1), U is a bivalent organic group, a single bond, —O—, or —SO$_2$—, V is a group comprising an aliphatic structure, and the carbon number in the aliphatic structure is 1 to 30,

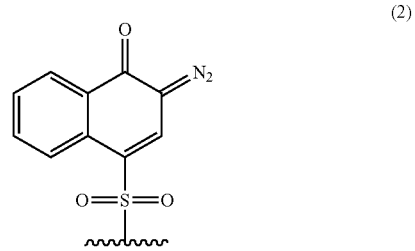

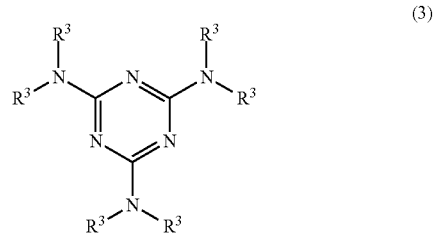

wherein, in Formula (3), $R^3$ is independently a hydrogen atom or —$CH_2$—O—$R^4$, and at least one of the plurality of $R^3$s is —$CH_2$—O—$R^4$, $R^4$ is independently a hydrogen atom, a methyl group, an ethyl group, or a butyl group, and wherein the (c) photosensitive agent is 1 to 20 parts by mass with respect to 100 parts by mass of the (a) polybenzoxazole precursor.

2. The positive-type photosensitive resin composition according to claim 1, wherein the (b) crosslinking agent is represented by Formula (4) below

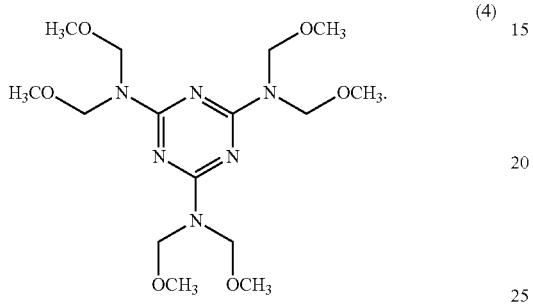

(4)

3. The positive-type photosensitive resin composition according to claim 1, wherein the (c) photosensitive agent is represented by Formula (5) below,

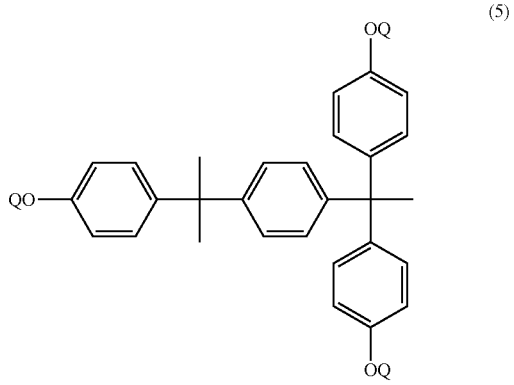

(5)

(in Formula (5), Q is independently a hydrogen atom or a group represented by Formula (6) below, and at least one Q is a group represented by Formula (6) below)

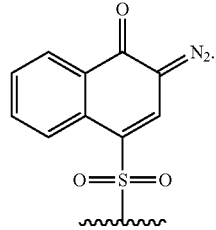

(6)

4. The positive-type photosensitive resin composition according to claim 1, wherein the aliphatic structure of V in Formula (1) is an aliphatic straight-chain structure having 5 to 10 carbon atoms.

5. A method of manufacturing a pattern cured film, comprising:
    coating the positive-type photosensitive resin composition according to claim 1 on a substrate, drying the positive-type photosensitive resin composition, and thereby forming a photosensitive resin film;
    exposing the photosensitive resin film to a predetermined pattern;
    developing the exposed photosensitive resin film by use of an alkaline aqueous solution, and thereby forming a pattern resin film; and
    heat-treating the pattern resin film.

6. The method of manufacturing the pattern cured film according to claim 5, wherein in heat-treating the pattern resin film, a heat treatment temperature is 200° C. or less.

7. A cured product of the positive-type photosensitive resin composition according to claim 1.

8. An interlayer insulating film, a cover coat layer, or a surface protection film using the cured product according to claim 7.

9. An electronic component comprising the interlayer insulating film, the cover coat layer, or the surface protection film according to claim 8.

10. The positive-type photosensitive resin composition according to claim 1, wherein the (c) photosensitive agent is 5 to 15 parts by mass with respect to 100 parts by mass of the (a) polybenzoxazole precursor.

* * * * *